(12) United States Patent
Inoue et al.

(10) Patent No.: US 6,683,004 B1
(45) Date of Patent: Jan. 27, 2004

(54) METHOD OF MANUFACTURING A SEMICONDUCTOR DEVICE, AND SEMICONDUCTOR DEVICE MANUFACTURED THEREBY

(75) Inventors: Masao Inoue, Tokyo (JP); Akinobu Teramoto, Tokyo (JP); Hiroshi Umeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/614,210

(22) Filed: Jul. 11, 2000

(30) Foreign Application Priority Data

Nov. 25, 1999 (JP) .......................................... 11-334823

(51) Int. Cl.[7] .............................................. H01L 21/00
(52) U.S. Cl. .......................... 438/692; 216/38; 216/88; 438/745
(58) Field of Search ................................. 438/700, 706, 438/723, 724, 690–693, 745; 216/38, 88, 89, 91

(56) References Cited

U.S. PATENT DOCUMENTS

| | | | |
|---|---|---|---|
| 4,845,055 A | | 7/1989 | Ogata ......................... 437/247 |
| 5,602,061 A | * | 2/1997 | Fujimaki ..................... 437/239 |
| 5,658,809 A | | 8/1997 | Nakashima et al. |
| 5,780,346 A | * | 7/1998 | Arghavani et al. .......... 438/296 |
| 5,863,827 A | | 1/1999 | Joyner ........................ 438/425 |
| 6,140,242 A | * | 10/2000 | Oh et al. .................... 438/698 |
| 6,239,476 B1 | * | 5/2001 | Gardner et al. ............. 257/513 |

FOREIGN PATENT DOCUMENTS

| | | |
|---|---|---|
| EP | 0482591 A1 | 4/1992 |
| EP | 0720218 A2 | 7/1996 |
| EP | 0817255 A2 | 1/1998 |
| EP | 0817255 A2 * | 1/1998 ........... H01L/21/66 |
| EP | 0817255 A3 | 4/1998 |
| EP | 0720218 A3 | 12/1998 |
| JP | 9-27504 | 1/1997 |
| JP | 09306800 | 11/1997 |
| JP | 11-176822 | 7/1999 |
| KR | 1999-72372 | 9/1999 |

OTHER PUBLICATIONS

European Search Report dated Oct. 20, 2000.

* cited by examiner

*Primary Examiner*—William A. Powell
(74) *Attorney, Agent, or Firm*—McDermott, Will & Emery

(57) ABSTRACT

There is described prevention of an increase in the thickness of an oxide film of a silicon wafer, which would otherwise be caused by eruption of gas from a CVD oxide film of another wafer during the course of a high-temperature annealing operation. A semiconductor device, which has a silicon substrate and trench isolation structures for isolating a plurality of active regions from one another, is manufactured by the steps as follows. A first and a second dielectric films are formed on the silicon substrate of one of the conductivity types. The dielectric films are removed from the areas of the silicon substrate where the trench structures are to be formed. The trench structures are formed in the uncovered areas of the silicon substrate to a predetermined depth. An oxide film is deposited into the respective trench structures by means of CVD after the oxide film has been deposited on the interior surface of the respective trench structure. The surface of the deposited oxide film is smoothed by means of removing the deposited oxide film from the silicon substrate through use of chemical-and-mechanical polishing. The second dielectric film is removed and the first dielectric film remains on the areas of the silicon substrate which are to become active regions. Then, the wafer is annealed in inactive gas at a temperature of 900° C. or less.

11 Claims, 6 Drawing Sheets

METHOD OF MANUFACTURING A SEMICONDUCTOR DEVICE, AND SEMICONDUCTOR DEVICE MANUFACTURED THEREBY

BACKGROUND OF THE INVENTION

1. Field of the Invention

The present invention relates to a method of manufacturing a semiconductor device, particularly a semiconductor device having a trench isolation structure filled with a CVD oxide film, and to a semiconductor device manufactured thereby. More particularly, the present invention relates to a semiconductor-device manufacturing method for preventing an increase in the thickness of an oxide film formed on a wafer, which would otherwise be caused when a semiconductor device is annealed.

2. Background Art

With reference to FIGS. 1 through 6 and FIGS. 11 through 13, there will be described a conventional method of manufacturing a semiconductor device having a trench isolation structure filled with a CVD oxide film, such as an HDP oxide film or a TEOS oxide film.

As shown in FIG. 1, a dielectric film 2a and another dielectric film 2b are formed on a silicon substrate 1 of one of conductivity types; for example, p-type. Usually, the dielectric film 2a is formed of a SiO2 film, and the dielectric film 2b is formed of a Si3N4 film. In order to form, on the silicon substrate 1, a plurality of active regions and a trench structure for isolating the active regions from one another, the dielectric film 2a, 2b are removed from the position of the surface of the silicon substrate 1 where a trench structure is to be formed. A trench structure 3 is formed to a desired depth in the uncovered area of the silicon substrate 1 through use of the appropriate etching technique, such as the dry etching technique. The silicon substrate 1 having the trench isolation structure 3 formed thereby is shown in FIG. 2.

The wafer is oxidized to an appropriate extent in order to remove an etching-damaged layer or to round the upper corner of the trench structure 3. As shown in FIG. 3, an oxide film 4 is formed along the interior wall surface of the trench structure 3.

As shown in FIG. 4, a CVD oxide film 5, such as a TEOS oxide film or an HDP oxide film, is deposited on the wafer, thereby filling the trench structure 3 with the CVD oxide film 5. As shown in FIG. 5, the surface of the thus-deposited oxide film 5 is removed and smoothed by a method such as a chemical-and-mechanical polishing (CMP) technique. As shown in FIG. 6, the dielectric film 2b is removed from the active regions of the silicon substrate 1, thereby forming a semiconductor device having a trench isolation structure.

In order to impart a desired conductivity to the active regions of the silicon substrate 1, the wafer is subjected to known ion implantation with the dielectric film 2a working as a damage protective film 6.

However, such a method cannot completely protect the silicon substrate 1 from damage stemming from ion implantation. In order to make the silicon substrate 1 recover from damage, after ion implantation the wafer is annealed at a high temperature of 1000° C. or more in an atmosphere of inactive gas (for example, nitrogen gas or argon gas) supplied at a flow rate of about 17 cm/min.

As mentioned previously, according to the conventional method, the wafer is annealed at a high temperature, which in turn induces evolution of gas from the CVD oxide film 5 embedded in the trench structure 3 during the course of annealing operation. In a case where wafers are stacked in layers within an annealing chamber, the resultant gas induces formation of an oxide film in a wafer provided below the wafer from which the gas has erupted, resulting in a problem of an increase in the thickness of the oxide films of the wafer.

As shown in FIG. 11, the thus-formed oxide film has a concentric thickness profile within the surface of the wafer, and the thickness of the oxide film gradually increases from the center to the outer periphery of the wafer. Therefore, in a case where the wafer is subjected to ion implantation by way of the thin thermal oxide film 6 after annealing operation, as indicated by arrows shown in FIG. 12, ions penetrate into the silicon substrate 1, as indicated by broken lines shown in FIG. 12; specifically, ions penetrate deep into the substrate at areas where there is formed the oxide film of smaller thickness and penetrate less deep into the substrate at areas where there is formed the oxide film of greater thickness. Thus, a variation arises in the profile of ion implantation.

The thermal oxide film 6 is usually removed before formation of a gate oxide film. However, if an attempt is made to remove the thickened oxide film, the amount to be etched must be increased accordingly. As a result, as shown in FIG. 13, an indentation 7 arises along an angular portion of the CVD oxide film deposited within the trench isolation structure 3, which in turn induces an increase in the standby current of a transistor.

The present invention has been conceived to solve such a drawback of the background art and is aimed at providing a method of manufacturing a semiconductor device capable of preventing an increase in the oxide-film thickness of another wafer, which would otherwise be caused by evolution of gas from the CVD oxide film when a wafer is subjected to high-temperature annealing. The present invention is also aimed at providing a semiconductor device manufactured by the method.

SUMMARY OF THE INVENTION

According to one aspect of the present invention, in a method of manufacturing a semiconductor device, which has a trench isolation structures on a silicon substrate, a dielectric film is formed on the silicon substrate of one of the conductivity types. The dielectric film is removed from the areas of the silicon substrate where the trench structures are to be formed. The trench structure is formed in the uncovered areas of the silicon substrate to a predetermined depth. An oxide film is deposited on the interior surface of the respective trench structure. An oxide film is deposited into the respective trench structure by means of CVD. The surface of the deposited oxide film is smoothed by removing the deposited oxide film on the silicon substrate through use of chemical-and-mechanical polishing. A thin oxide film is formed over the areas of the silicon substrate which are to become active regions. Further, the silicon substrate is annealed in inactive gas either at a temperature of 900° C. or less, or the silicon substrate is annealed in inactive gas which is supplied at a flow rate of about 35 cm/min.

According to another aspect of the present invention, in a method of manufacturing a semiconductor device, which has a trench isolation structure on a silicon substrate, the process is the same as described above until an annealing step after ion implantation. Further, the silicon substrate is annealed one by one in inactive gas, or the processed silicon substrate is annealed with dummy wafers, which do not erupt any gas, arranged in alternating layers.

According to another aspect of the present invention, in a method of manufacturing a semiconductor device, which has a trench isolation structures on a silicon substrate, the process is the same as described above until an annealing step after ion implantation. Further, the silicon substrate is either thermally oxidized after formation of the thin thermal oxidation film, or an SiN or SiON film is formed on the surface of the thin thermal oxidation film. Thereafter, the silicon substrate is annealed in inactive gas.

Other and further objects, features and advantages of the invention will appear more fully from the following description.

DETAILED DESCRIPTION OF THE PREFERRED EMBODIMENTS

First Embodiment

A first embodiment of the present invention will now be described. A manufacturing process of the present embodiment is the same as that of the background art shown in FIGS. 1 through 6, until a step of removing the dielectric film 2b from the active regions of the silicon substrate 1.

Figure 1:
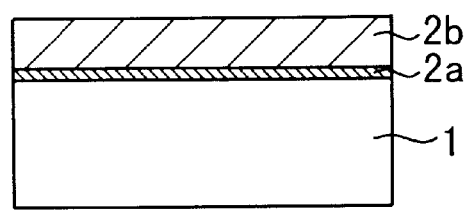
FIGS. 1 through 6 show a method of manufacturing a semiconductor device having a trench isolation structure in the respective embodiment of the present invention and in a conventional method.

In more detail, as shown in FIG. 1, a first dielectric film 2a and a second dielectric film 2b are formed on a silicon substrate 1 of one of conductivity types; e.g., p-type. Usually, the first dielectric film 2a is formed of a SiO2 film, and the second dielectric film 2b is formed of a Si3N4 film.

Figure 2:
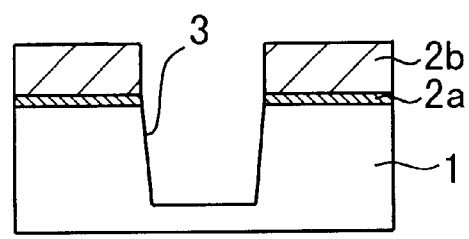
Figure 3:
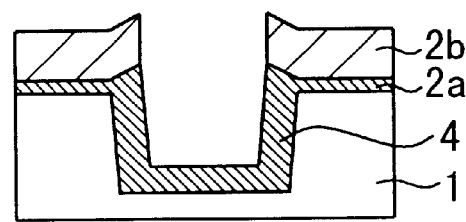

In order to form, on the silicon substrate 1, a plurality of active regions and a trench structure for isolating the active regions from one another, the dielectric films 2a and 2b are removed from the position of the surface of the silicon substrate 1 where a trench structure is to be formed. A trench structure 3 is formed to a desired depth in the uncovered area of the silicon substrate 1 through use of the appropriate etching technique, such as the dry etching technique. The silicon substrate 1 having the trench isolation structure 3 formed therein is shown in FIG. 2. The wafer is oxidized to an appropriate extent in order to remove an etching-damaged layer or to round the upper corner of the trench structure 3. As shown in FIG. 3, an oxide film 4 is formed along the interior wall surface of the trench structure 3.

Figure 4:
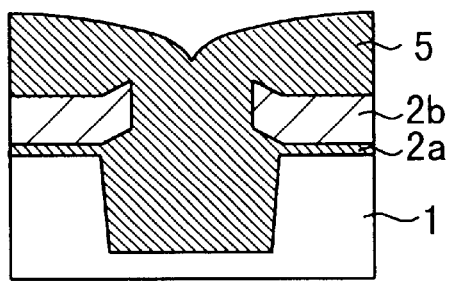
Figure 5:
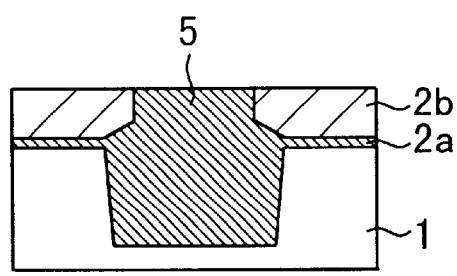
Figure 6:
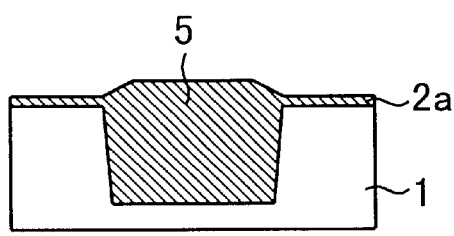

As shown in FIG. 4, a CVD oxide film 5, such as a TEOS oxide film or an HDP oxide film, is deposited on the wafer, thereby filling the trench structure 3 with the CVD oxide film 5. As shown in FIG. 5, the surface of the thus-deposited oxide film 5 is removed and smoothed by a method such as the chemical-and-mechanical polishing (CMP) technique. As shown in FIG. 6, the dielectric film 2b is removed from the active regions of the silicon substrate 1 and the dielectric film 2a remains, thereby forming a semiconductor device having a trench isolation structure.

In order to impart a desired conductivity to the active regions of the silicon substrate 1, the wafer is subjected to known ion implantation with the dielectric film 2a working as a damage protective film 6.

However, such a method cannot completely protect the silicon substrate 1 from damage stemming from ion implantation. In order to make the silicon substrate 1 recover from damage, after undergoing ion implantation, the wafer is annealed in an atmosphere of inactive gas (for example, nitrogen gas or argon gas) supplied at a flow rate of about 17 cm/min and, in the present embodiment, at a low temperature of 900° C. or less.

Since no gas erupts from the CVD oxide film at a temperature of 900° C. or less, there is no risk of an increase in the thickness of an oxide film formed on other wafers within the annealing chamber.

Second Embodiment

A second embodiment of the present invention will now be described. A manufacturing process of the present embodiment is the same as that of the background art, until an annealing step after ion implantation. The present embodiment is characterized in the layout of wafers within the annealing chamber.

Figure 7:
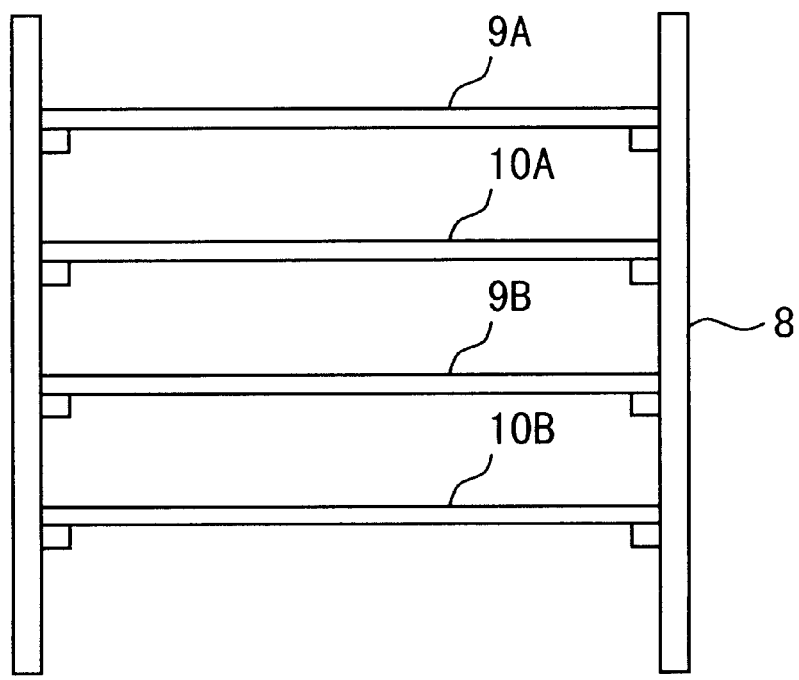
FIG. 7 is a schematic representation of a wafer support apparatus in a second embodiment of the present invention.

FIG. 7 is a schematic representation for describing the present embodiment, showing wafers supported within the annealing chamber. In this drawing, reference numeral 8 designates a wafer support shelf and has a structure for supporting wafers into layers arranged in the vertical direction. Reference numerals 9A and 9B designate wafers which are in need of annealing and are supported in the first and third layers in the support shelf 8.

Reference numerals 10A and 10B designate dummy wafers whose silicon substrates are uncovered. Any type of wafer may be used as a dummy wafer unless a film, which will erupt gas, is not formed on the surface thereof.

The dummy wafers 10A and 10B are supported in the second and fourth layers in the support shelf 8. In other words, the wafers 9A and 9B which are in need of annealing and the dummy wafers 10A and 10B are arrange on alternating layers and are annealed in an active gas at a high temperature of 1000° C. or more, as in the case of the background art.

Gas erupting from the CVD film 5 of; for example, the wafer 9A reaches the dummy wafer 10A provided one layer below the wafer 9A but substantially does not reach the wafer 9B provided two layers below the wafer 9A. Therefore, even if gas erupts from the CVD oxide film of the wafer 9A, no increase arises in the thickness of the oxide film of the wafer 9B provided two layers below the wafer 9A.

FIG. 7 shows an example in which wafers and dummy wafers are supported in four layers. However, the same result is yielded even when wafers and dummy wafers are stacked in five layers or more.

Third Embodiment

A third embodiment of the present invention will now be described. A manufacturing process of the present embodiment is the same as that of the first embodiment, until a step of removing the second dielectric film 2b and exposing the first dielectric film 2a. The present embodiment is characterized in an annealing step following the step of forming the thermal oxide film 6. More specifically, the present embodiment is characterized in that in the annealing step inactive gas is supplied at a flow rate of about 35 cm/min., which is faster than that at which the inactive gas is supplied in the background art.

The inactive gas and the annealing temperature are the same as those employed in the background art.

As a result of an increase in the flow rate of inactive gas, the gas erupting from the CVD oxide film flows together with the inactive gas, thereby substantially preventing occurrence of an increase in the thickness of an oxide film of a wafer provided below another wafer from which the gas has erupted, within the annealing chamber.

Fourth Embodiment

A fourth embodiment of the present invention will now be described. A manufacturing process of the present embodiment is the same as that of the first embodiment, until the ion implantation step. Further, the annealing step following the ion implantation step of the present embodiment is the same as that of the manufacturing process of the background art. The present embodiment is characterized in that the following additional step is effected between the ion implantation step and the annealing step. More specifically, the wafer is subjected to thermal oxidation before the annealing step until a film of about 100 angstroms in thickness is formed over the surface of the silicon substrate 1. In the annealing step, the wafer is annealed in inactive gas at a high temperature of 1000° C. or more, as in the case of the background art.

The thermal oxide film formed in the surface area of the CVD oxide film 5 acts as a cap layer, thereby effectively preventing eruption of a gas from a wafer and preventing an increase in the thickness of the oxide film of another wafer during the annealing step.

Fifth Embodiment

Figure 8:
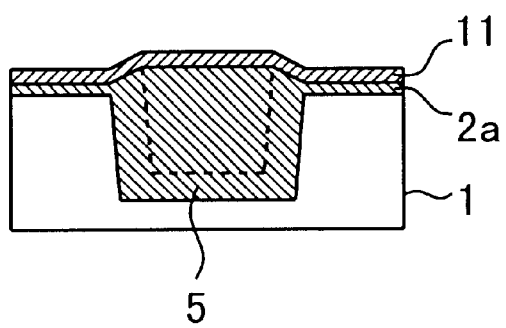
FIG. 8 shows a SiN film or a SiON film deposited by the CVD technique on the thin thermal oxidation film before the annealing in a fourth embodiment of the present invention.

Next will now be described a fifth embodiment of the present invention. A manufacturing process of the present embodiment is the same as that of the fourth embodiment, until the ion implantation step. Further, the annealing step following the ion implantation step of the present embodiment is the same as that of the background art. The present embodiment is characterized in that the following additional step is effected between the ion implantation step and the annealing step. More specifically, as shown in FIG. 8, a SiN film or a SiON film 11 is deposited to a thickness of about 100 angstroms on the first dielectric film 2a before the annealing step, by means of the CVD technique.

Subsequently, the wafer is annealed in active gas at a high temperature of 1000° C. or more, as in the case of the background art.

The SiN film or SiON film 11 employed in the present embodiment covers the CVD oxide film 5 as well as the first dielectric film 2a and acts as a cap layer, thereby effectively preventing eruption of a gas from a wafer and preventing an increase in the thickness of an oxide film of another wafer during the annealing step.

Sixth Embodiment

Next will now be described a sixth embodiment of the present invention. A manufacturing process of the present embodiment is the same as that of the first embodiment, until the step shown in FIG. 6; i.e., a step of removing the second dielectric film 2b and exposing the first dielectric film 2a.

The present embodiment is characterized in the annealing step following the step of removing the second dielectric film 2b. More specifically, a wafer is annealed with use of a single wafer processing machine and without use of the annealing chamber in which a plurality of wafers are processed in a single annealing operation.

The present embodiment eliminates the fear of an increase in the thickness of an oxide film of another wafer.

Seventh Embodiment

A seventh embodiment of the present invention will now be described. In the present embodiment, a semiconductor device is manufactured through use of a silicon substrate having a trench isolation structure processed according to the technique relating to any one of the first through sixth embodiments.

Figure 9:
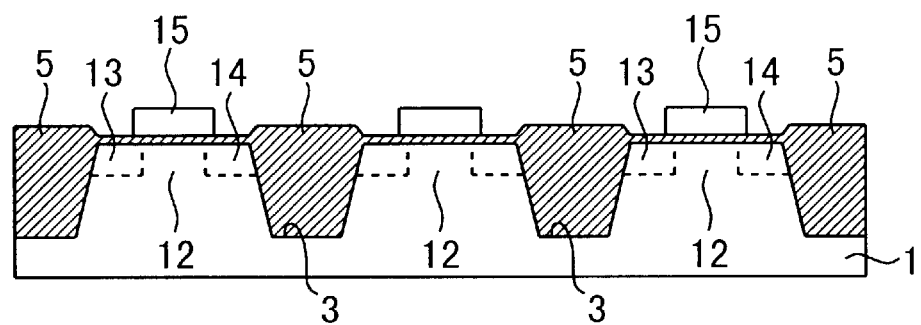
FIGS. 9 and 10 show transistors formed in a seventh embodiment of the present invention.

FIG. 9 shows transistors formed according to the present embodiment. The CVD oxide film 5 is deposited into each of the trench isolation structures 3, thereby isolating active regions 12 from one another. A source region 13, a drain region 14, and a gate electrode 15 are formed in each of the active regions 12, thereby forming a transistor respectively.

The thus-formed transistors exhibit little variation in the concentration of implanted ions within the plane of the wafer and has a good isolation structure free of indentations.

Therefore, there are formed transistors which induce small variation in threshold voltage and requires a low standby current.

Eighth Embodiment

Figure 10:
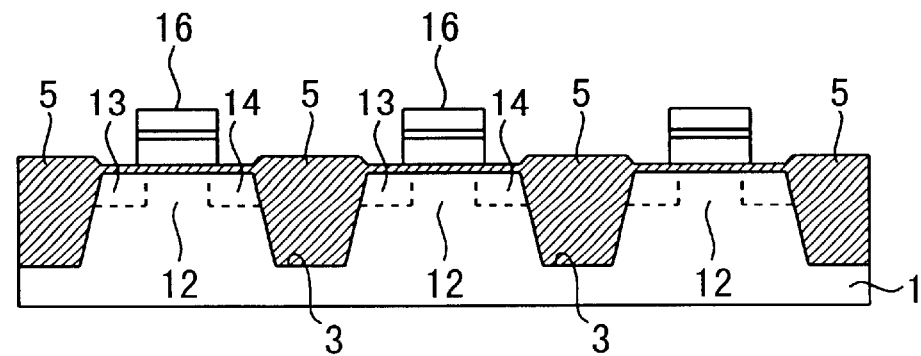
Figure 11:
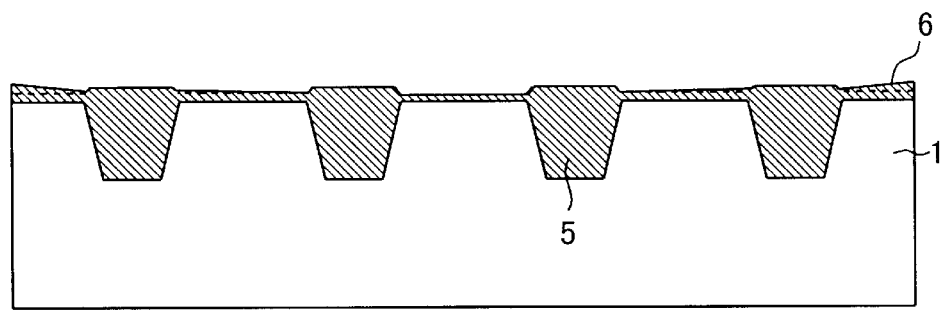
FIGS. 11 through 13 show a method of manufacturing a semiconductor device having a trench isolation structure in a conventional method.
Figure 12:
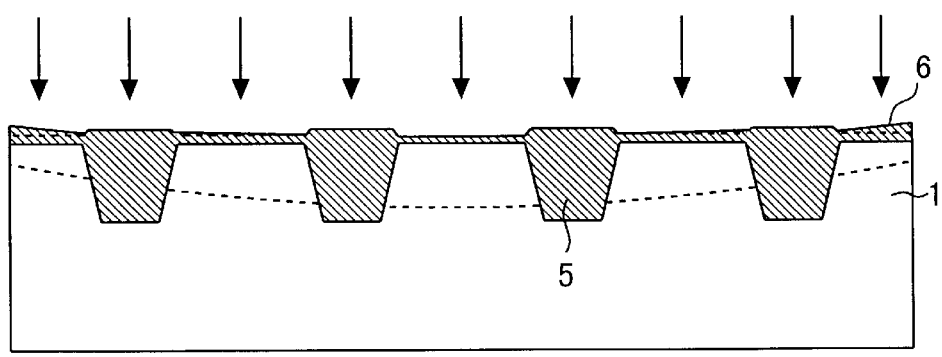
Figure 13:
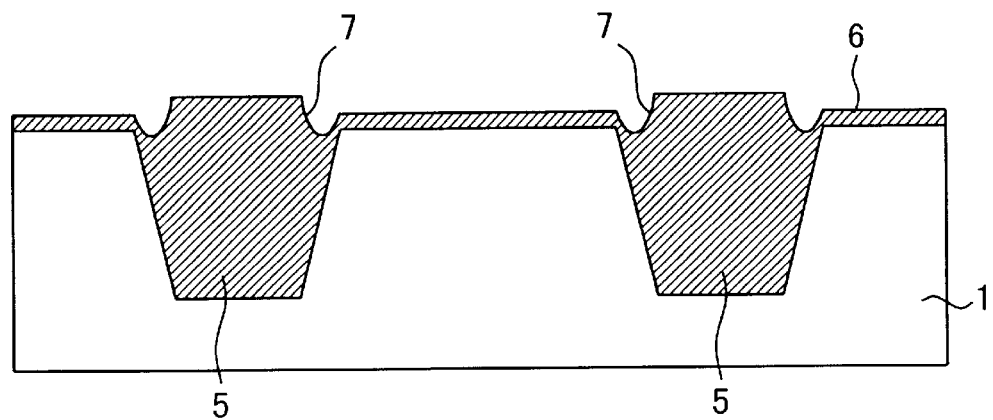

An eighth embodiment of the present invention will now be described. As in the seventh embodiment, in the present embodiment, a source region, a drain region, and a gate electrode are formed in each of the active regions 12 of the silicon substrate 1 having the trench isolation structures 3 processed by the technique of any one of the first through sixth embodiments. As denoted by reference numeral 16 shown in FIG. 10, a gate electrode is formed in the form of a floating gate.

Even in this case, there are formed transistors which induce small variations in threshold voltage and requires a low standby current.

The features and the advantages of the present invention as described above may be summarized as follows.

In one aspect, under the method of manufacturing a semiconductor device according to the present invention, a wafer is annealed at a low temperature of 900° C. or less in inactive gas, and hence no gas erupts from the CVD oxide film, thereby preventing an increase in the thickness of an oxide film of another wafer, which would otherwise be caused within an annealing chamber.

In another aspect, under the method of manufacturing a semiconductor device according to the present invention, dummy wafers, whose silicon substrates are uncovered or coated with a film which would not cause eruption of gas, and actual wafers to be processed are annealed within the annealing chamber while they are arranged in alternating layers. Therefore, even if gas erupts from the CVD oxide film of a wafer, no increase arises in the thickness of an oxide film of other wafers.

In another aspect, under the method of manufacturing a semiconductor device according to the present invention, a wafer is annealed in inactive gas which is supplied at a flow rate of about 35 cm/min. As a result, no substantial increase arises in the thickness of an oxide film of another wafer within the annealing chamber.

In another aspect, under the method of manufacturing a semiconductor device according to the present invention, after the second dielectric film 2b is removed and the first dielectric film 2a is exposed, the wafer is subjected to thermal oxidation, to thereby form a film of about 100 angstrom thickness. Alternatively, a SiN film or a SiON film is deposited to a thickness of about 100 angstroms. These films act as cap layers, thereby preventing an increase in the thickness of an oxide film during the annealing step.

In another aspect, under the method of manufacturing a semiconductor device according to the present invention, a wafer is annealed in inactive gas within an annealing chamber of a single wafer processing apparatus, thus eliminating the fear of an increase in the thickness of an oxide film.

In another aspect, under the method of manufacturing a semiconductor device according to the present invention, a source region, a drain region, and a gate electrode or a floating gate are formed in each of the active regions of the silicon substrate processed by the technique relating to any one of the previous embodiments, and hence there are formed semiconductor devices which induce low variation in threshold voltage and requires a small standby current.

Obviously many modifications and variations of the present invention are possible in the light of the above teachings. It is therefore to be understood that within the scope of the appended claims the invention may by practiced otherwise than as specifically described.

The entire disclosure of a japanese patent application no. 11-334823, filed on Nov. 25, 1999 including specification, claims, drawings and summary, on which the convention priority of the present application is based, are incorporated herein by reference in its entirety.

What is claimed is:

1. A method of manufacturing a semiconductor device which has a trench isolation structure on a silicon substrate for isolating a plurality of active regions on said silicon substrate from one another, the method comprising the steps of:

forming a first dielectric film and a second dielectric film on said silicon substrate;

removing said first and second dielectric films from the areas of said silicon substrate where the trench structures are to be formed;

forming the trench structures in the uncovered areas of said silicon substrate;

forming an oxide film on said interior surface of the respective trench structures;

depositing an oxide film into said respective trench structures by means of CVD;

smoothing the surface of said deposited oxide film by removing said deposited oxide film on said silicon substrate through use of chemical-and-mechanical polishing to expose the second dielectric film;

after said step of smoothing the surface, removing the second dielectric film to expose the first dielectric film; and after said step of removing t he second dielectric film to expose the first dielectric film, annealing said silicon substrate in inactive gas at a temperature of 900° C. or less.

2. A method of manufacturing a semiconductor device which has a trench isolation structure on a silicon substrate for isolating a plurality of active regions on said silicon substrate from one another, the method comprising the steps of:

forming a first dielectric film and a second dielectric film on said silicon substrate;

removing said first and second dielectric films from the areas of said silicon substrate where the trench structures are to be formed;

forming the trench structures in the uncovered areas of said silicon substrate;

forming an oxide film on said interior surface of the respective trench structures;

depositing an oxide film into said respective trench structures by means of CVD;

smoothing the surface of said deposited oxide film by removing said deposited oxide film on said silicon substrate through use of chemical-and-mechanical polishing to expose the second dielectric film;

after said step of smoothing the surface, removing the second dielectric film to expose the first dielectric film; and after said step of removing the second dielectric film to expose the first dielectric film, annealing the single silicon substrate in inactive gas in a single-wafer processing machine.

3. A method of manufacturing a semiconductor device which has a trench isolation structure on a silicon substrate for isolating a plurality of active regions on said silicon substrate from one another, the method comprising the steps of:

forming a first dielectric film and a second dielectric film on said silicon substrate;

removing said first and second dielectric films from the areas of said silicon substrate where the trench structures are to be formed;

forming the trench structures in the uncovered areas of said silicon substrate;

forming an oxide film on said interior surface of the respective trench structures;

depositing an oxide film into said respective trench structures by means of CVD;

smoothing the surface of said deposited oxide film by removing said deposited oxide film on said silicon substrate through use of chemical-and-mechanical polishing to expose the second dielectric film;

after said step of smoothing the surface, removing the second dielectric film to expose the first dielectric film;

after said step of removing the second dielectric film to expose the first dielectric film, implanting ions into said silicon substrate through said first dielectric film;

after said step of implanting ions into said silicon substrate, forming an SiN or SiON film on the surface of said deposited oxide film which remains in said respective trench structures; and after said step of forming an SiN or SiON film, annealing the silicon substrate in inactive gas.

4. The method of manufacturing a semiconductor device according to claim 3, wherein the SiN or SiON film is deposited to a thickness of about 100 angstroms.

5. A semiconductor device manufactured by the method according to claim 1.

6. A method of manufacturing a semiconductor device which has a trench isolation structure on a silicon substrate for isolating a plurality of active regions on said silicon substrate from one another, the method comprising the steps of:

forming a first dielectric film and a second dielectric film on said silicon substrate;

removing said first and second dielectric films from the areas of said silicon substrate where the trench structures are to be formed;

forming the trench structures in the uncovered areas of said silicon substrate;

forming an oxide film on said interior surface of the respective trench structures;

depositing an oxide film into said respective trench structures by means of CVD;

smoothing the surface of said deposited oxide film by removing said deposited oxide film on said silicon substrate through use of chemical-and-mechanical polishing to expose the second dielectric film;

after said step of smoothing the surface, removing the second dielectric film to expose the first dielectric film; and after said step of removing the second dielectric film to expose the first dielectric film, annealing said silicon substrate in inactive gas which is supplied at a flow rate of about 35 cm/min.

7. A method of manufacturing a semiconductor device which has a trench isolation structure on a silicon substrate for isolating a plurality of active regions on said silicon substrate from one another, the method comprising the steps of:

forming a first dielectric film and a second dielectric film on said silicon substrate;

removing said first and second dielectric films from the areas of said silicon substrate where the trench structures are to be formed;

forming the trench structures in the uncovered areas of said silicon substrate;

forming an oxide film on said interior surface of the respective trench structures;

depositing an oxide film into said respective trench structures by means of CVD;

smoothing the surface of said deposited oxide film by removing said deposited oxide film on said silicon substrate through use of chemical-and-mechanical polishing to expose the second dielectric film;

removing the second dielectric film to expose the first dielectric film; and after said step of removing the second dielectric film, annealing said silicon substrate with dummy wafers, which do not erupt any gas, wherein said silicon substrate and the dummy wafers are arranged in alternating positions within an annealing chamber.

8. A method of manufacturing a semiconductor device which has a trench isolation structure on a silicon substrate for isolating a plurality of active regions on said silicon substrate from one another, the method comprising the steps of:

forming a first dielectric film and a second dielectric film on said silicon substrate;

removing said first and second dielectric films from the areas of said silicon substrate where the trench structures are to be formed;

forming the trench structures in the uncovered areas of said silicon substrate;

forming an oxide film on said interior surface of the respective trench structures;

depositing an oxide film into said respective trench structures by means of CVD;

smoothing the surface of said deposited oxide film by removing said deposited oxide film on said silicon substrate through use of chemical-and-mechanical polishing to expose the second dielectric film;

after said step of smoothing the surface, removing the second dielectric film to expose the first dielectric film;

after said step of removing the second dielectric film to expose the first dielectric film, thermally oxidizing the surface of said deposited oxide film which remains in said respective trench structures; and after said step of thermally oxidizing, annealing the silicon substrate in inactive gas.

9. The method of manufacturing a semiconductor device according to claim 8, wherein the surface of said deposited oxide film is thermally oxidized to a thickness of about 100 angstroms.

10. The method of manufacturing a semiconductor device according to claim 1, wherein said whole step of annealing said silicon substrate in inactive gas is performed at a temperature of 900° C. or less.

11. The method of manufacturing a semiconductor device according to claim 1, further comprising a step of implanting, after said step of removing the second dielectric film prior to said step of annealing said silicon substrate, ions into said silicon substrate through said first dielectric film.

* * * * *